United States Patent
Tsujita

(10) Patent No.: US 8,207,034 B2
(45) Date of Patent: Jun. 26, 2012

(54) SEMICONDUCTOR MEMORY DEVICE AND METHOD OF MANUFACTURING SEMICONDUCTOR MEMORY DEVICE

(75) Inventor: Kenji Tsujita, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 95 days.

(21) Appl. No.: 12/843,499

(22) Filed: Jul. 26, 2010

(65) Prior Publication Data

US 2011/0037114 A1 Feb. 17, 2011

(30) Foreign Application Priority Data

Aug. 13, 2009 (JP) .................................. 2009-187671

(51) Int. Cl.
*H01L 21/336* (2006.01)

(52) U.S. Cl. ........ 438/257; 438/258; 438/264; 438/266; 257/316

(58) Field of Classification Search .......... 438/257–258, 438/264, 266; 257/316, E21.422, E29.3
See application file for complete search history.

(56) References Cited

U.S. PATENT DOCUMENTS

| 6,800,525 B2 * | 10/2004 | Ryu et al. ...................... 438/257 |
| 6,974,748 B2 | 12/2005 | Moon et al. |
| 2003/0113969 A1 * | 6/2003 | Cho et al. ...................... 438/257 |
| 2007/0228444 A1 | 10/2007 | Nakata et al. |

FOREIGN PATENT DOCUMENTS

| JP | 9-92734 A | 4/1997 |
| JP | 2005-72578 A | 3/2005 |
| JP | 2007-273593 A | 10/2007 |

* cited by examiner

*Primary Examiner* — Theresa T Doan
(74) *Attorney, Agent, or Firm* — Foley & Lardner LLP

(57) ABSTRACT

A semiconductor memory device is formed to include: a substrate; a floating gate formed on the substrate via a gate insulating film; a control gate formed on an adjacent position to the floating gate via a tunnel insulating film; a spacer insulating film formed on the floating gate; and a protection film formed between the spacer insulating film and the control gate. In such a semiconductor memory device (MC), the protection film functions as a stopper of a side surface of the spacer insulating film when a part other than the spacer insulating film is etched.

4 Claims, 17 Drawing Sheets

VARIATION OF RECESS AMOUNT OF OXIDE FILM 110 ARISES DUE TO VARIATION IN WET ETCHING

OVERLAP AMOUNT

SEMICONDUCTOR MEMORY DEVICE AND METHOD OF MANUFACTURING SEMICONDUCTOR MEMORY DEVICE

INCORPORATION BY REFERENCE

This Patent Application is based on Japanese Patent Application No. 2009-187671. The disclosure of the Japanese Patent Application is incorporated herein by reference.

BACKGROUND OF THE INVENTION

1. Field of the Invention

The present invention relates to a semiconductor memory device and a method of manufacturing the same, and more specifically to a nonvolatile semiconductor memory device capable of electrical writing/erasing and a method of manufacturing same.

2. Description of Related Art

A split gate nonvolatile memory is known as one kind of a nonvolatile semiconductor memory device capable of electrical writing/erasing (for example, see Japanese Patent Application Publication JP-A-Heisei, 9-92734, which is referred to as Patent Literature 1). In the split gate nonvolatile memory, only a part of a control gate overlaps with a floating gate. The floating gate and a part of the control gate are provided on a channel region, and thus not only the floating gate but also this part of the control gate are used for switching. Thus, the split-gate nonvolatile memory has an advantage that an excessive erasing error is prevented.

A threshold voltage of a nonvolatile memory cell transistor varies depending on an amount of charges held by the floating gate. For example, in the case of an N-channel memory cell, through a program operation, electrons are implanted into the floating gate and thus the threshold voltage increases. On the other hand, through an erasing operation, the electrons are drawn out from the floating gate and thus the threshold voltage decreases. At time of a reading operation, a read current does not flow to a program cell, but the read current flows to an erasing cell. Therefore, comparison between an amount of the read current and a predetermined reference current Iref makes it possible to sense data stored in the memory cell transistor. A transistor the same as the memory cell transistor is conventionally used as a reference transistor for generating this reference current Iref (see Japanese Patent Application Publication JP2005-72578A, which is referred to as Patent Literatures 2, and JP 2007-273593A, referred to as Patent Literature 3). This reference transistor is fixed in an erasing state.

FIG. 1 is a sectional view showing a semiconductor memory device disclosed in Patent Literature 2. Referring to FIG. 1, a semiconductor substrate 100 is divided into: a memory cell region where a flash memory cell is formed; and a logic region where a logic device is formed. The semiconductor substrate is divided into an active region and a field region 101.

On the memory cell region, a split gate electrode structure 130 is formed. In this split gate electrode structure 130, split gate oxide film patterns 102a, floating gates 104a, and silicon oxide film patterns 110 are deposited, and inside a gap between the silicon oxide film patterns 110, a source line 120 connected to the semiconductor substrate 100 is provided. At a portion of the substrate connected to the source line 120, impurity is doped to form a source region 203.

The split gate oxide film pattern 102a is provided as a floating gate oxide film pattern of a flash memory and the floating gate 104a is provided by a split gate pattern.

Along profiles of surfaces of the split gate electrode structure 130 and the semiconductor substrate 100, a silicon oxide film 132 is provided. This silicon oxide film 132 is provided as a gate oxide film of a logic device, a word line oxide film, and a tunnel gate between a split gate pattern and a word line.

On both sides of the split gate electrode structure 130 where the silicon oxide film 132 is formed, control gates 150 are provided. This control gate 150 has a shape with its lower outer side surface more projected laterally than its upper outer side surface. That is, the channel length of the control gate 150 is further extended by the length by which its lower side surface is projected laterally.

An upper tip on one side surface of the floating gate 104a opposing the control gate 150 has a sharp-pointed shape. Thus, charges filled in the floating gate 104a are easily released to the control gate 150 through this tip portion. Moreover, at time of programming, a voltage applied to the control gate 150 is easily coupled to the floating gate 104a.

In the logic region, a logic gate pattern 152 is provided which has a thickness thinner than the channel length of the control gate 150. Providing the shape such that the lower side surface of the control gate 150 is projected laterally permits ensuring the channel length of the control gate 150 regardless of the thickness of the logic gate pattern 152.

FIGS. 2A to 2G are sectional views illustrating a method of forming a semiconductor device disclosed in Patent Literature 2. Referring to FIG. 2A, the memory region where the memory cell is formed and the logic region where the logic device is formed are sectionalized on the semiconductor substrate 100. The active region and the field region 101 are formed by applying normal element isolation processing. For this element isolation processing, a Shallow Trench Isolation (STI) processing is preferably used.

Subsequently, on the semiconductor substrate 100, the first silicon oxide film 102, a floating gate first polysilicon film 104, and a first nitride film are sequentially formed. Subsequently, a predetermined portion of the first nitride film formed on the memory cell region is etched by a normal photolithography processing to form a first nitride film pattern 106 for defining a floating gate region.

Referring to FIG. 2B, by using the first nitride film pattern 106 as a mask, the floating gate first polysilicon film 104 is partially subjected to isotropic etching. As a result of carrying out the isotropic etching step, an edge of the floating gate first polysilicon film 104 is rounded since a film etching speed of the edge portion of the floating gate first polysilicon film 104 in contact with the first nitride film pattern 106 is relatively slower. The isotropic etching includes plasma etching and wet etching.

A portion where the edge of the floating gate first polysilicon film 104 is curved serves as an upper tip portion of a split gate pattern formed through subsequent processing. Therefore, the upper tip portion of the split gate pattern formed by the subsequent processing consequently has a sharp-pointed shape.

Referring to FIG. 2C, a second silicon oxide film 108 is formed along top and side surfaces of the first nitride film pattern 106 and a top surface of the floating gate first polysilicon film 104. Referring to FIG. 2D, the second silicon oxide film 108 is subjected to anisotropic etching to form silicon oxide film patterns 110 on side surfaces of the first nitride film pattern 106. At this point, the anisotropic etching is carried out in such a manner that the floating gate first polysilicon film 104 is exposed to a surface and the entire second silicon oxide film 108 on the top surface of the first nitride film pattern 106 is removed.

Subsequently, the floating gate first polysilicon film 104 exposed by the etching processing is etched and subsequently the first silicon oxide film 102 is etched to thereby expose a surface of the semiconductor substrate 100. The floating gate first polysilicon film 104 is divided into two parts separated from each other by this processing.

Subsequently, a silicon oxide 112 having a thin thickness is formed on a side surface of the floating gate first polysilicon film 104 so that the side surface of the floating gate first polysilicon film 104 is not exposed to outside.

Referring to FIG. 2E, impurity ions are implanted under the exposed surface of the semiconductor substrate 100 to form the source region 203. Subsequently, a second polysilicon film is formed in such a manner as to fill a gap between the silicon oxide film patterns 110. The second polysilicon film is electrically connected to the source region 203. Subsequently, the second polysilicon film is flattened in such a manner that the second polysilicon film remains in a gap between second silicon oxide film patterns and the top surface of the first nitride film pattern 106 is exposed to the outside, whereby a source line 120 is formed. As the flattering process, the CMP or etch-back processing can be adopted.

Referring to FIG. 2F, the first nitride film pattern 106 is removed and the floating gate first polysilicon film 104 and the first silicon oxide film 102 provided below the first nitride film pattern 106 are sequentially removed. Therefore, on the semiconductor substrate 100, the split gate oxide film patterns 102a, the floating gate patterns 104a, and the silicon oxide film patterns 110 are deposited, and the split gate electrode structure 130 having the split gate oxide film patterns 102a is formed between the silicon oxide film patterns 110.

Of the split gate electrode structure 130, the split gate oxide film patterns 102a are provided as a floating gate oxide film of the flash memory and the floating gates 104a are provided as a floating gate of the flash memory.

This etching step proceeds without a specially provided photomask pattern. Therefore, while the floating gate first polysilicon film 104 is etched, an upper surface of the source line 120 is partially etched. Moreover, while the first silicon oxide film 102 is etched, side surface portions of the silicon oxide film patterns 110 are partially etched.

Referring to FIG. 2G, a silicon oxide film 132 is formed along profiles of a surface of the split gate electrode structure 130 and a surface of the semiconductor substrate 100. This silicon oxide film 132 is provided as a gate oxide film of a logic element, a word line oxide film, and a tunnel gate between a first polysilicon film pattern and a word line.

Subsequently, a polysilicon film 134 is formed on the silicon oxide film 132. This polysilicon film 134 is formed with a fixed thickness along the profile of the split gate electrode structure 130. Therefore, the polysilicon film 134 is formed such that a portion where the split gate electrode structure 130 is formed is projected relative to its surroundings. The polysilicon film 134 is formed to be a word line of the flash memory cell and a gate electrode of the logic device.

Here, the manufacturing processes of FIGS. 2E to 2F will be described in more detail. FIG. 2H shows the memory cell region in FIG. 2E. The first nitride film pattern 106 is removed by wet etching, so that the side surfaces of the silicon oxide film patterns 110 and the top surface of the floating gate first polysilicon film 104 are exposed (FIG. 2I). Subsequently, the floating gate first polysilicon film 104 located immediately below the removed first nitride film pattern 106 is removed by dry etching (FIG. 2J). At this point, the remained floating gate first polysilicon film 104 is formed as the floating gate 104a. Subsequently, the first silicon oxide film 102 is removed by wet etching (FIG. 2K). At this point, the side surfaces of the silicon oxide film patterns 110 are recessed by the wet etching.

SUMMARY

The present inventor has recognized as follows. In the wet etching, due to variation in solution temperature, composition, etc. and variation in film quality of the silicon oxide film patterns 110, an etching rate slightly varies. The variation does not raise any particular problem in the removal of the first silicon oxide film 102, but has an influence such that variation arises in an amount of recession of the side surfaces of the silicon oxide film patterns 110 to be etched simultaneously (FIG. 2L).

The variation in the amount of recession of the side surfaces of the silicon oxide film patterns 110 results in variation in an amount of overlapping between the floating gate 104a and the control gate 150 (FIG. 2M) and variation in a capacity ratio (FIG. 2N), thus causing a problem of flash property failure.

For resolving the above explained problems, a semiconductor memory device (MC (Memory Cell)) is manufactured by the following method.
(a) A first nitride film is formed which has a first opening portion on a polysilicon film after forming the polysilicon film on a gate insulating film formed on a substrate.
(b) A second nitride film is formed on a surface of the first nitride film after forming a first oxide film covering a surface of the polysilicon film exposed in the first opening portion, a side surface of the first nitride film, and an upper surface of the first nitride film.
(c) A first spacer insulating film is formed which has a second opening portion and formed to be a sidewall shape after forming a second oxide film filling the first opening portion and performing an etch back to the second oxide film.
(d) The polysilicon film and the gate insulating film are removed selectively in the second opening portion after removing the second nitride film and the first oxide film selectively by using the first spacer insulating film as a mask, and filling the second opening portion by polysilicon.
(e) A selective polysilicon film removal is performed by: removing the first nitride film to expose a surface of the polysilicon covered by the first oxide film and the first nitride film in a side region of the first spacer insulating film; and removing the polysilicon film selectively by using the first oxide film as a mask.
(f) The first oxide film on a side of the first spacer insulating film and the gate insulating film being exposed are removed.
(g) A control gate is formed after forming a tunnel insulation film.

Further, to solve the above explained problems, a semiconductor memory device is formed to include: a substrate; a floating gate formed on the substrate via a gate insulating film; a control gate formed on an adjacent position to the floating gate via a tunnel insulating film; a spacer insulating film formed on the floating gate; and a protection film formed between the spacer insulating film and the control gate. In such a semiconductor memory device (MC), the protection film functions as a stopper of a side surface of the spacer insulating film when a part other than the spacer insulating film is etched.

Briefly explaining a representative effect provided by the invention disclosed in the present application, the variation in the amount of overlapping between the floating gate and the control gate is suppressed.

The amount of overlapping between the floating gate and the control gate is fixed without any influence from variation in etching, whereby a capacity ratio of each gate becomes fixed, which makes it possible to suppress the flash property failure.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Figure 1:
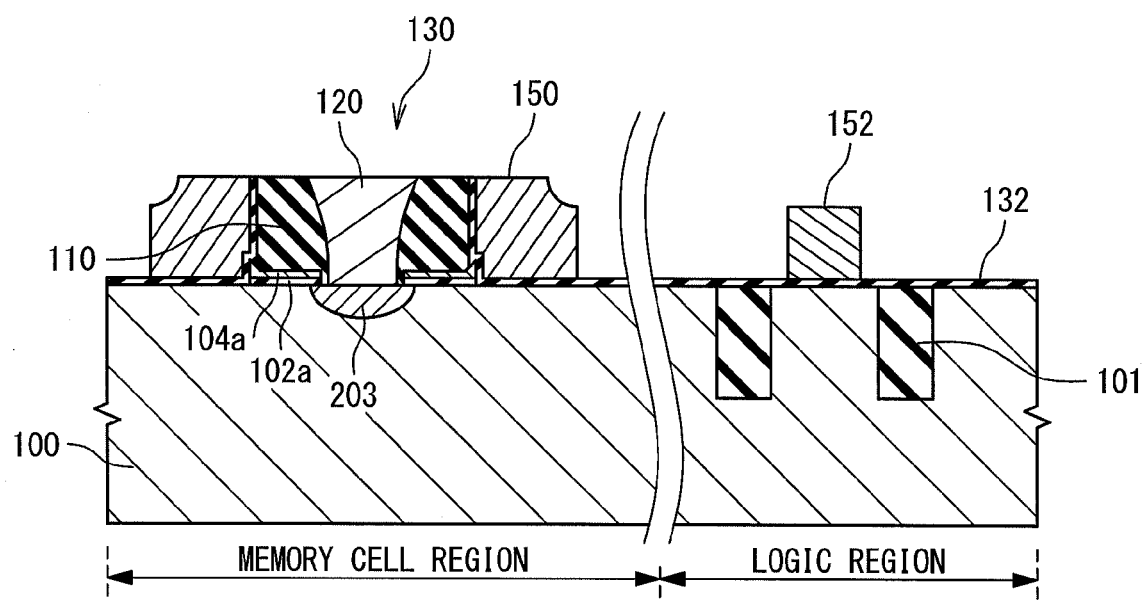
FIG. 1 is a sectional view showing a conventional semiconductor memory device.
Figure 2A:
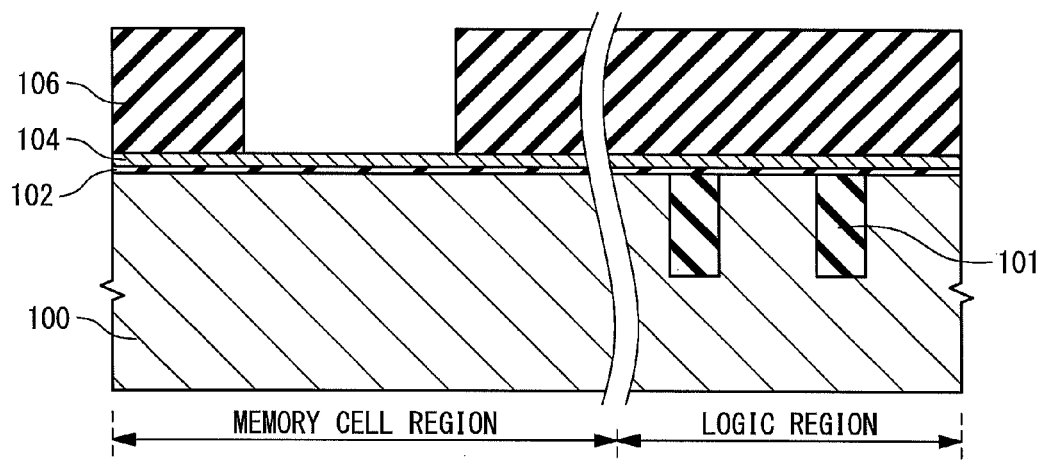
FIG. 2A is a sectional view showing a method of forming the conventional semiconductor device.
Figure 2B:
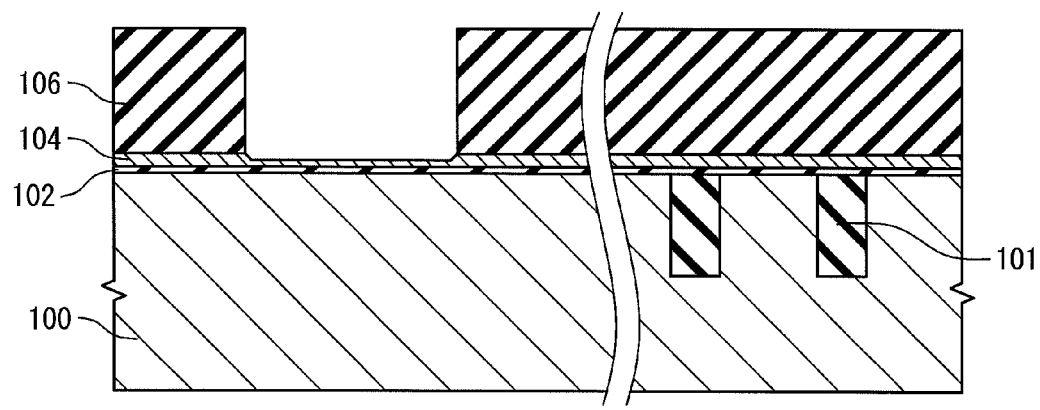
FIG. 2B is a sectional view showing the method of forming the conventional semiconductor device.
Figure 2C:
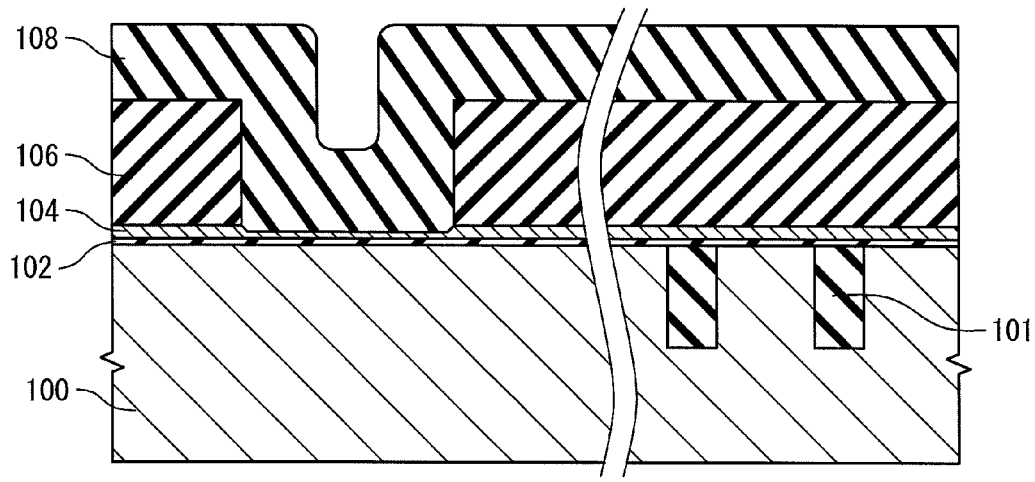
FIG. 2C is a sectional view showing the method of forming the conventional semiconductor device.
Figure 2D:
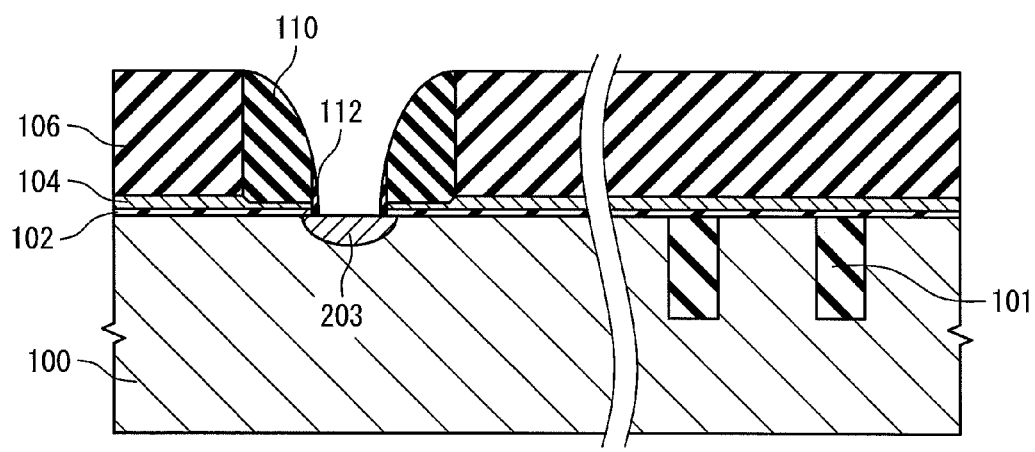
FIG. 2D is a sectional view showing the method of forming the conventional semiconductor device.
Figure 2E:
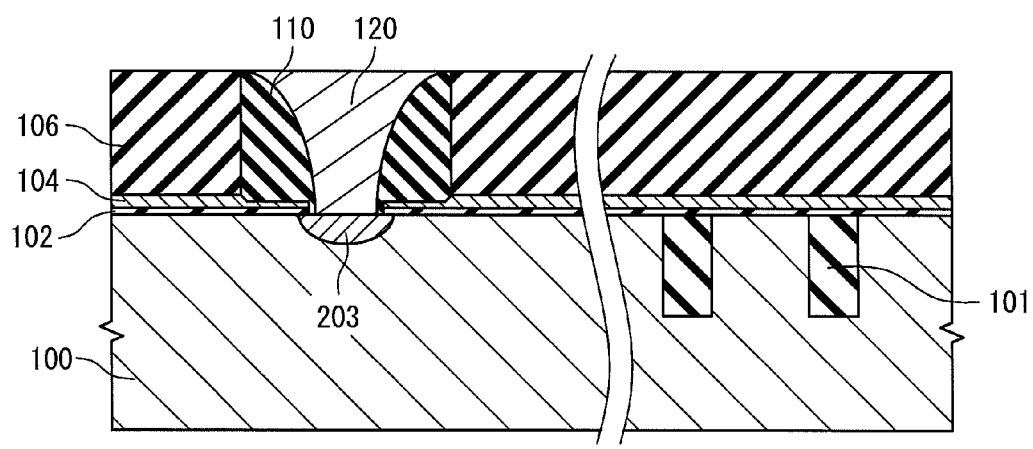
FIG. 2E is a sectional view showing the method of forming the conventional semiconductor device.
Figure 2F:
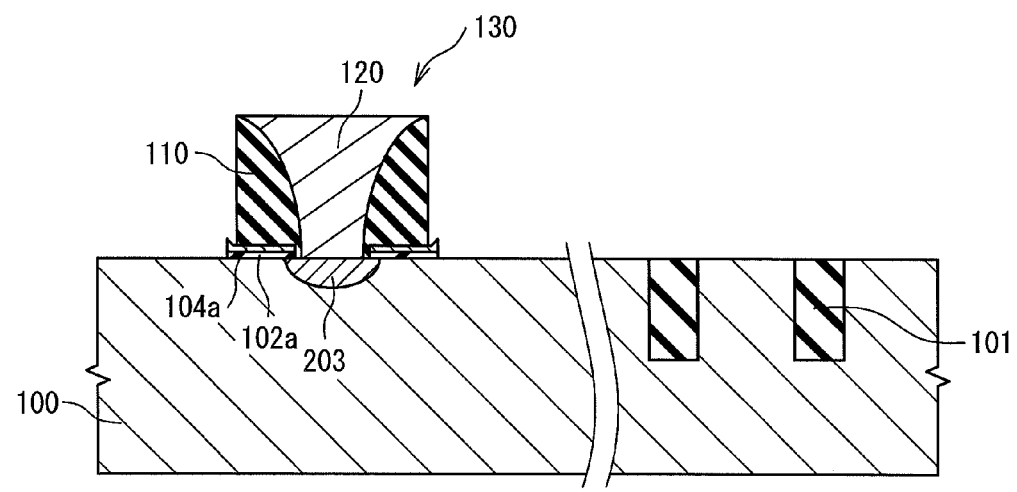
FIG. 2F is a sectional view showing the method of forming the conventional semiconductor device.
Figure 2G:
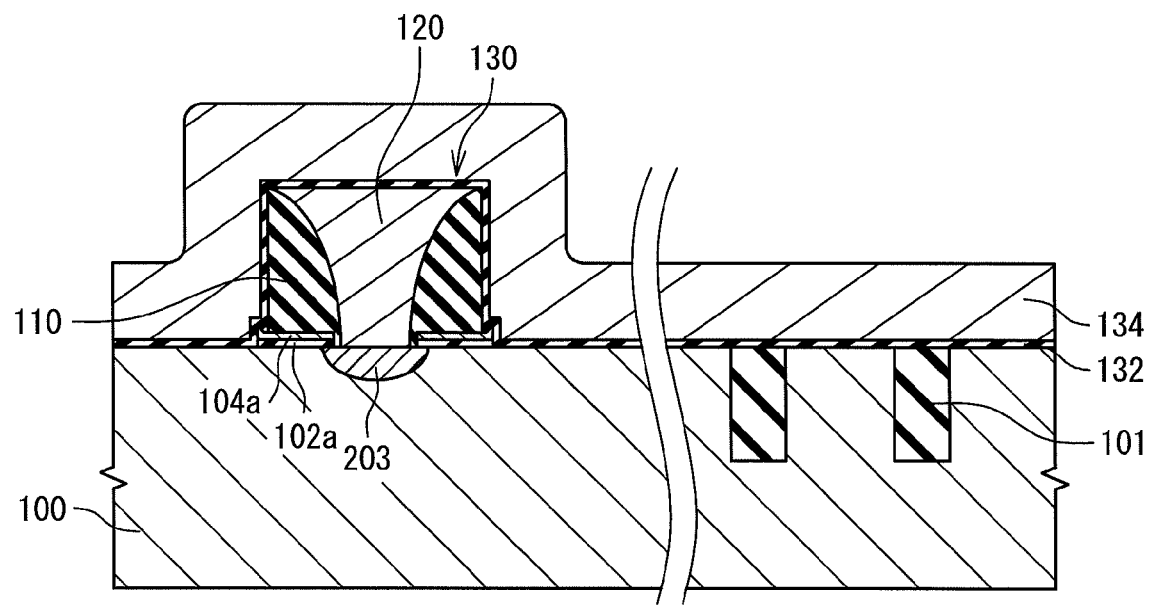
FIG. 2G is a sectional view showing the method of forming the conventional semiconductor device.
Figure 2H:
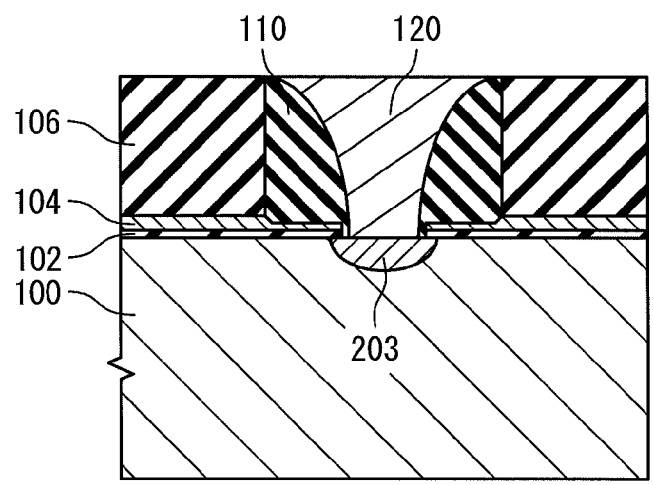
FIG. 2H is a detailed sectional view showing a method of manufacturing the conventional semiconductor device.
Figure 2I:
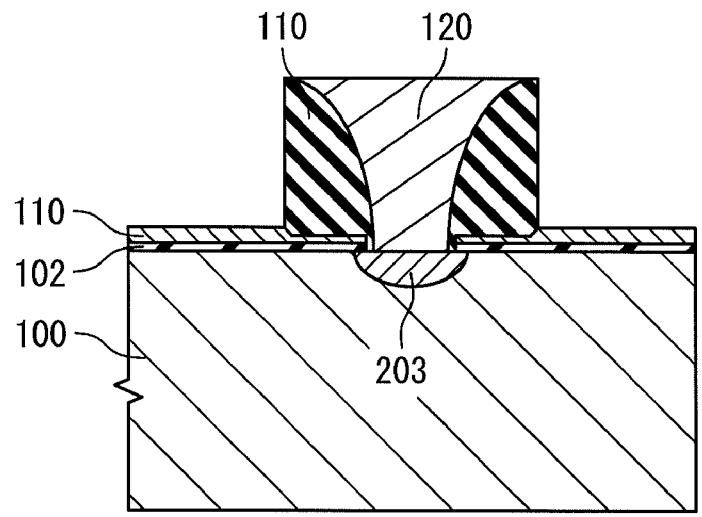
FIG. 2I is a detailed sectional view showing the method of manufacturing the conventional semiconductor device.
Figure 2J:
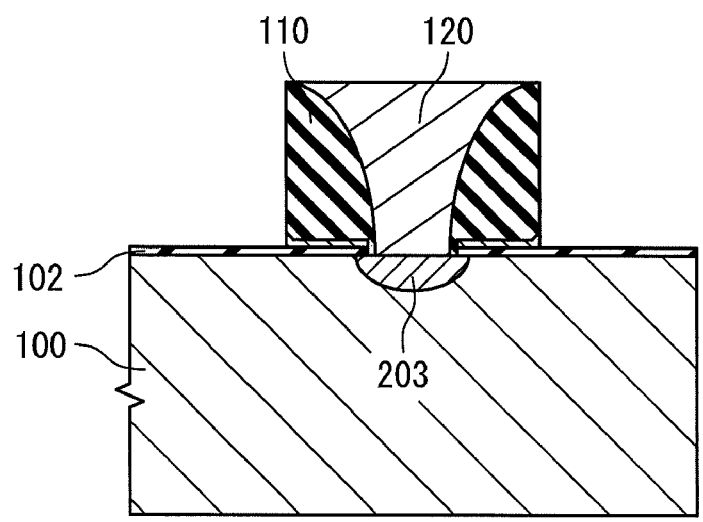
FIG. 2J is a detailed sectional view showing the method of manufacturing the conventional semiconductor device.
Figure 2K:
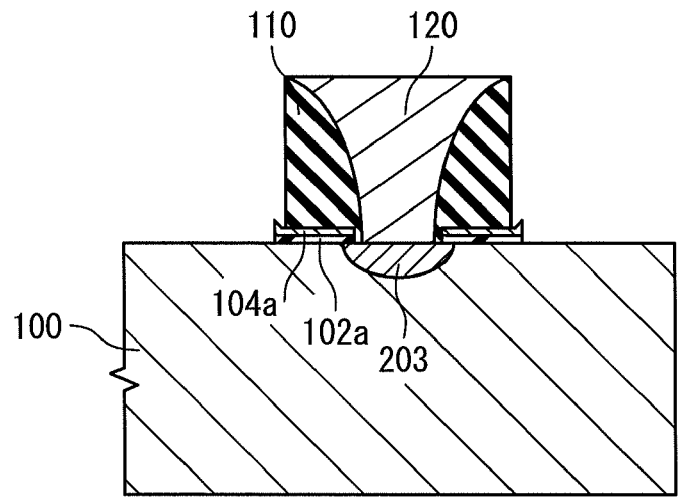
FIG. 2K is a detailed sectional view showing the method of manufacturing the conventional semiconductor device.
Figure 2L:
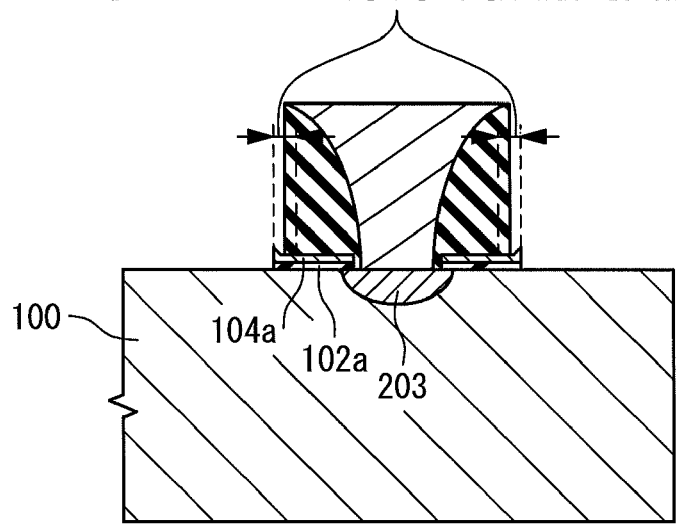
FIG. 2L is a sectional view showing a configuration of the conventional semiconductor device.
Figure 2M:
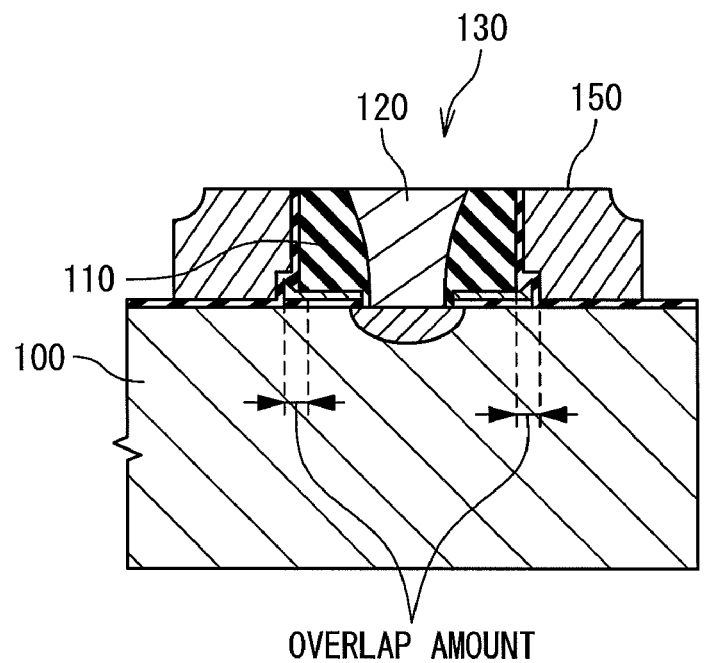
FIG. 2M is a detailed sectional view showing the method of manufacturing the conventional semiconductor device.
Figure 2N:
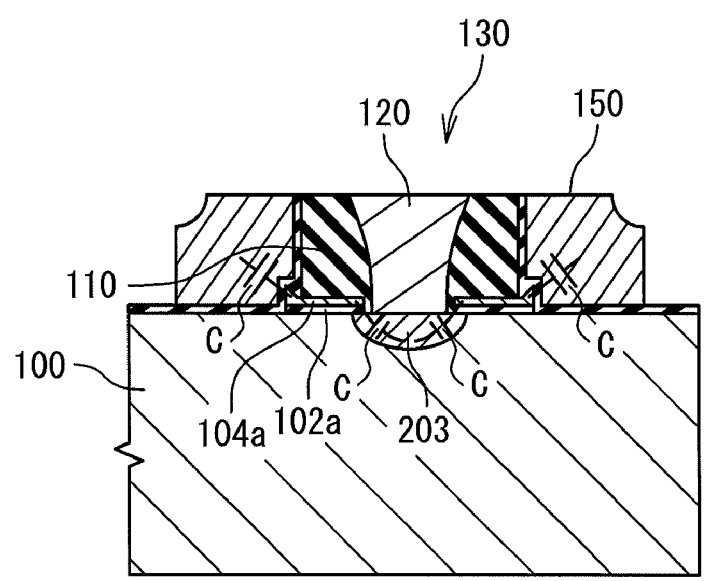
FIG. 2N is a detailed sectional view showing the method of manufacturing the conventional semiconductor device.

Hereinafter, some exemplary embodiments of the present invention will be described referring to the accompanying drawings. Note that in the drawings illustrating embodiments, the same members are basically provided with the same numerals, and repeated description thereof will be omitted.

Figure 3:
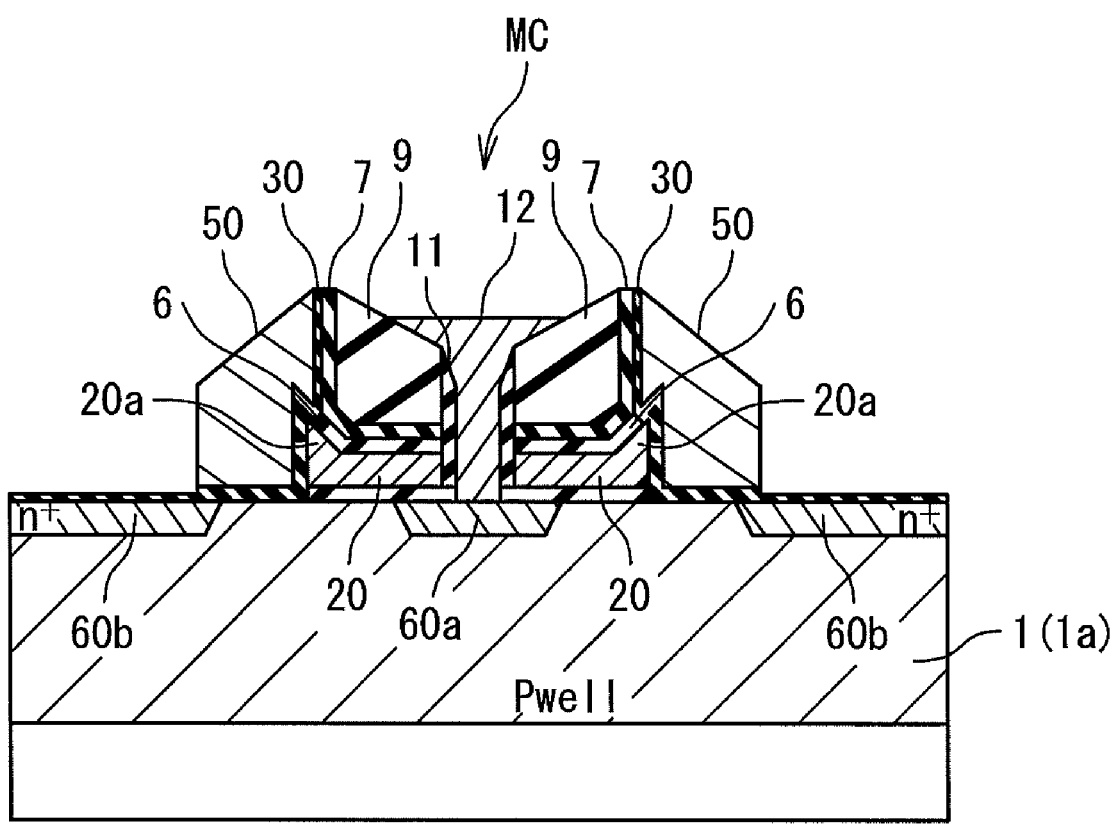
FIG. 3 is a sectional view illustrating a configuration of a memory cell transistor MC of the present embodiment.

FIG. 3 is a sectional view illustrating a configuration of a memory cell transistor MC mounted on a semiconductor memory device according to the present embodiment. The memory cell transistor MC is provided on a substrate 1 or a well 1a of the substrate 1. More specifically, a diffusion layer 60a and diffusion layers 60b serving as a source and a drain are formed in the substrate 1.

For example, when the well 1a (or the substrate 1) is a p-well (or P-type semiconductor substrate), the diffusion layer 60a and the diffusion layers 60b are n-type impurity regions. On the diffusion layer 60a, a contact 12 connected thereto is formed. With each of both sides of the contact 12, a plug-side spacer 11 being an insulation film is in contact.

Moreover, on each of the both sides of the contact 12, a floating gate 20 is formed with the plug-side spacer 11 therebetween. In other words, between the floating gate 20 and the contact 12, the plug-side spacer 11 for electrically insulating them from each other lies. Between the floating gate 20 and the substrate 1, a gate insulating film 2 is formed.

The floating gate 20 partially overlaps with the diffusion layer 60a, and the floating gate 20 and the diffusion layer 60a are capacitively-coupled together with the gate insulating film 2 therebetween. Moreover, a first spacer (silicon oxide film) 9, a second spacer (silicon nitride film) 7, and a third spacer (silicon oxide film) 6 are formed on the floating gate 20 as insulation films. Further, an end part of the floating gate 20 opposite to an end part thereof where the plug-side spacer 11 is arranged is in contact with a tunnel oxide film 30. As described above, the floating gate 20 is surrounded by insulation films and electrically insulated from outside. Depending on the amount of charges held in this floating gate 20, the threshold voltage of the memory cell transistor MC varies.

Furthermore, adjacent to the floating gate 20, a control gate 50 is formed with the tunnel oxide film 30 therebetween. That is, the control gate 50 is provided on a side opposite to the contact 12 when the position of the floating gate 20 is taken as a reference.

As shown in FIG. 3, only a part of the control gate 50 is formed to overlap with the floating gate 20. The remaining portion of the control gate 50 is provided on the substrate 1 without overlapping with the floating gate 20. The tunnel oxide film 30 not only lies between the control gate 50 and the floating gate 20 but also lies between the control gate 50 and the substrate 1 as a gate insulating film.

As described above, on the both sides of the contact 12 connected to the diffusion layer 60a, a pair of floating gates 20 and a pair of control gates 50 are provided. Further, in the substrate 1 on outer sides of the control gates 50, a pair of diffusion layers 60b is formed. That is, into the memory cell transistor MC of a split-gate type shown in FIG. 3, 2-bit data can be stored. The memory cell transistor MC according to the present embodiment is of the split-gate type. On a channel region, a part of the floating gates 20 and a part of the control gates 50 are provided. Thus, in the memory cell transistor MC, an excessive erasing error is prevented.

As shown in FIG. 3, the floating gate 20 has a tip part 20a of a prickle shape. Specifically, the floating gate 20 has a shape such that a portion thereof overlapping with the control gate 50 is sharpened in a direction from the floating gate 20 to the control gate 50. In each of the floating gates 20 on the both sides of the contact 12, the tip part 20a is formed on a tunnel oxide film 30 side. As a result, each of the floating gates 20 has a top surface concaved in such a manner as to face the contact 12.

The memory cell transistor MC of the present embodiment includes second spacers (silicon nitride films) 7. This second spacer (silicon nitride film) 7 serves as a stopper that protects a side surface of the first spacer (silicon oxide film) 9 in manufacturing process of the memory cell transistor MC. By this stopper, the side surface of the first spacer (silicon oxide film) 9 are prevented from being excessively etched. The recession of the side surface of the first spacer (silicon oxide film) 9 caused by the variation in etching is suppressed. Therefore, the amount of the overlapping between the floating gate 20 and the control gate 50 can be fixed without an influence of the variation in etching.

Figure 4A:
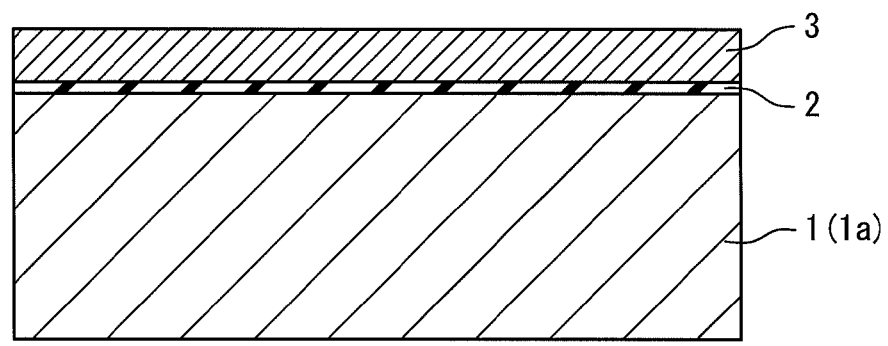
FIG. 4A is a sectional view illustrating a semiconductor structure in a first step of manufacturing the memory cell transistor MC.

Next, a method of manufacturing the memory cell transistor MC mounted on the semiconductor memory device of the present embodiment will be described. FIG. 4A is a sectional view illustrating a semiconductor structure in a first step of manufacturing the memory cell transistor MC. First, a silicon substrate is provided as the substrate 1, and a well 1a is formed in this substrate 1. Then as shown in FIG. 4A, a gate insulating film 2 is formed on the substrate 1. Subsequently, on the gate insulating film 2, a first gate polysilicon film 3 (with a film thickness of 1000 Å) is formed. As shown later on, the first gate polysilicon film 3 serves as floating gates 20.

Figure 4B:
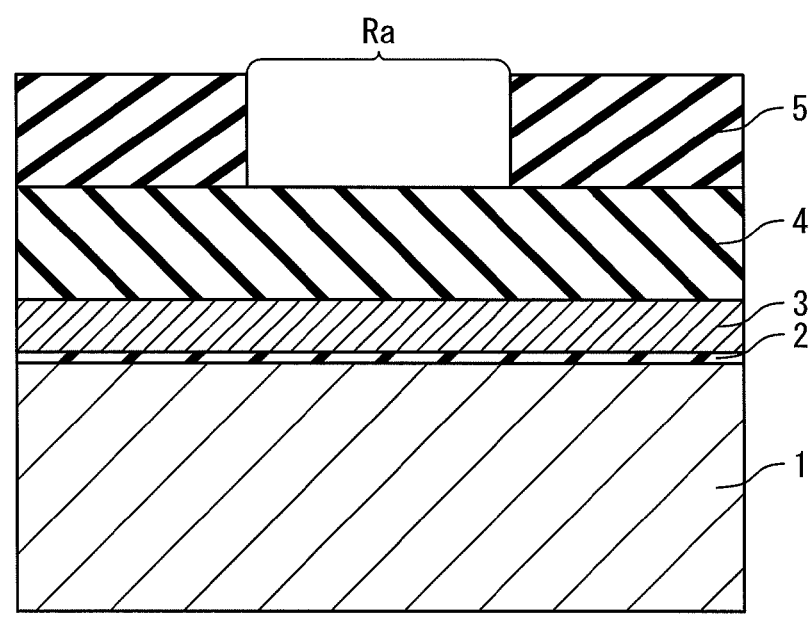
FIG. 4B is a sectional view illustrating a semiconductor structure in a second step of manufacturing the memory cell transistor MC.

FIG. 4B is a sectional view illustrating a semiconductor structure in a second step of manufacturing the memory cell transistor MC. As shown in FIG. 4B, in this second step, a silicon nitride film 4 (with a film thickness of 4000 Å) is deposited on the first gate polysilicon film 3. Further, resist is applied on an entire surface, and then through a photolithography technique, a resist mask 5 having a predetermined pattern is provided on the silicon nitride film 4. This resist mask 5 opens at a region Ra.

Figure 4C:
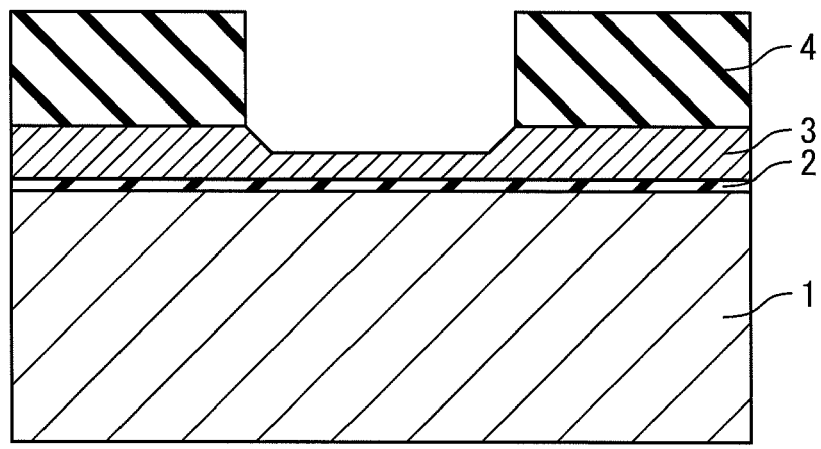
FIG. 4C is a sectional view illustrating a semiconductor structure in a third step of manufacturing the memory cell transistor MC.

FIG. 4C is a sectional view illustrating a semiconductor structure in a third step of manufacturing the memory cell transistor MC. In this third step, by use of this resist mask 5, etching of the silicon nitride film 4 and isotropic etching of a part of the first gate polysilicon film 3 are performed. As a result, as shown in FIG. 4C, the entire silicon nitride film 4 and the part of the first gate polysilicon film 3 in the region Ra are removed. An end part of the first gate polysilicon film 3 partially removed is sloped-shaped and serves as the tip part 20a of the floating gate 20.

Figure 4D:
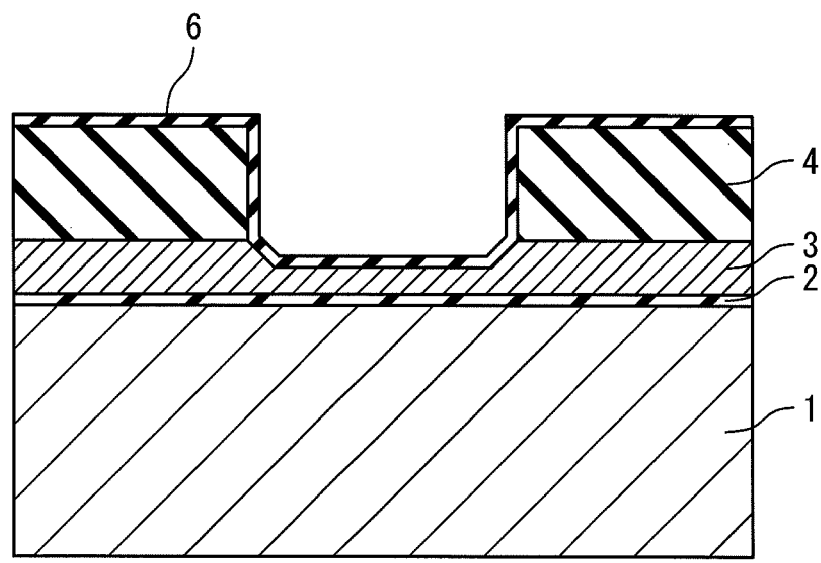
FIG. 4D is a sectional view illustrating a semiconductor structure in a fourth step of manufacturing the memory cell transistor MC.
Figure 4E:
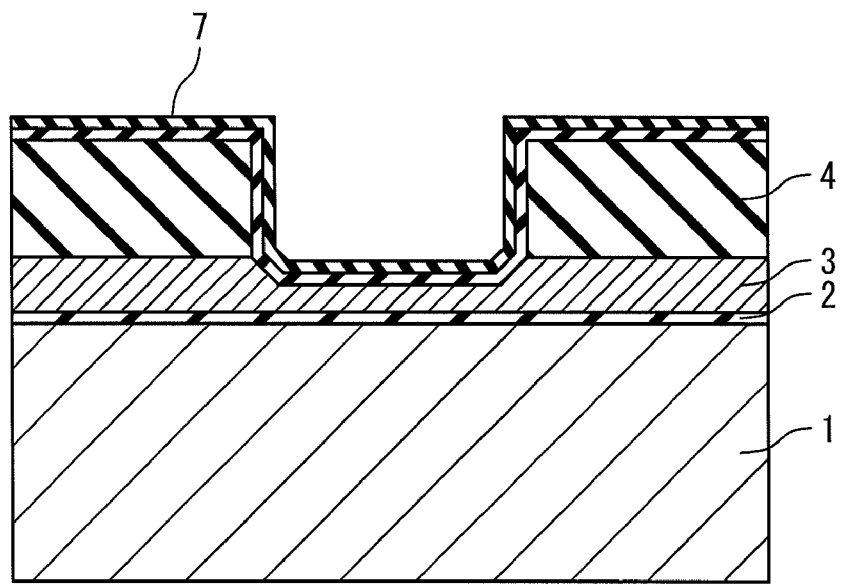
FIG. 4E is a sectional view illustrating a semiconductor structure in a fifth step of manufacturing the memory cell transistor MC.

FIG. 4D is a sectional view illustrating a semiconductor structure in a fourth step of manufacturing the memory cell transistor MC. As shown in FIG. 4D, in this fourth step, a third spacer (silicon oxide film) 6 (with a film thickness of 200 Å) is deposited on an entire surface. FIG. 4E is a sectional view illustrating a semiconductor structure in a fifth step of manufacturing the memory cell transistor MC. As shown in FIG. 4E, in this fifth step, the second spacer (silicon nitride film) 7 (with a film thickness of 100 Å) is deposited on an entire surface of the third spacer (silicon oxide film) 6.

Figure 4F:
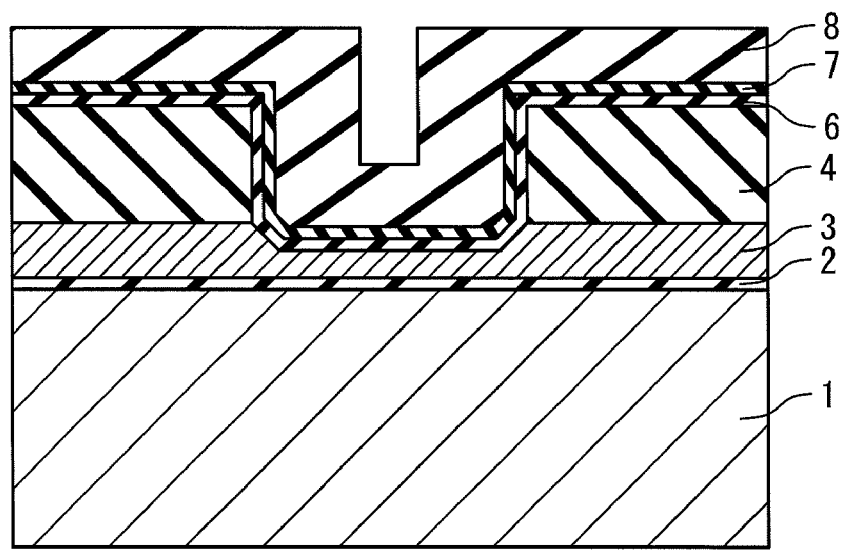
FIG. 4F is a sectional view illustrating a semiconductor structure in a sixth step of manufacturing the memory cell transistor MC.
Figure 4G:
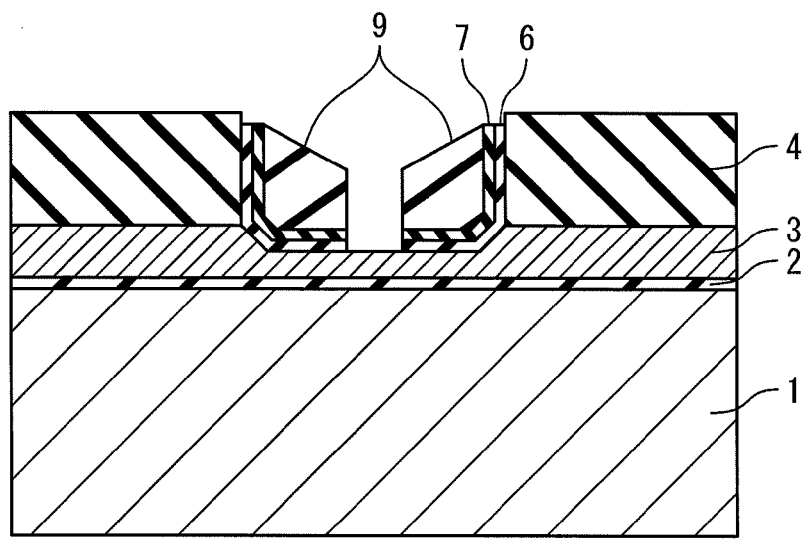
FIG. 4G is a sectional view illustrating a semiconductor structure in a seventh step of manufacturing the memory cell transistor MC.

FIG. 4F is a sectional view illustrating a semiconductor structure in a sixth step of manufacturing the memory cell transistor MC. As shown in FIG. 4F, in this sixth step, a first oxide film 8 is deposited on an entire surface of the second spacer (silicon nitride film) 7. FIG. 4G is a sectional view illustrating a semiconductor structure in a seventh step of manufacturing the memory cell transistor MC. In the seventh step, the first oxide film 8 is etched whereby the first spacers (silicon oxide films) 9 are formed in a self-aligned manner, as shown in FIG. 4G. Specifically, a pair of first spacers (silicon oxide films) 9 is formed on part of the first gate polysilicon film 3 in the region Ra. The two first spacers (silicon oxide films) 9 are each in contact with an end part of the silicon nitride film 4, facing each other.

Figure 4H:
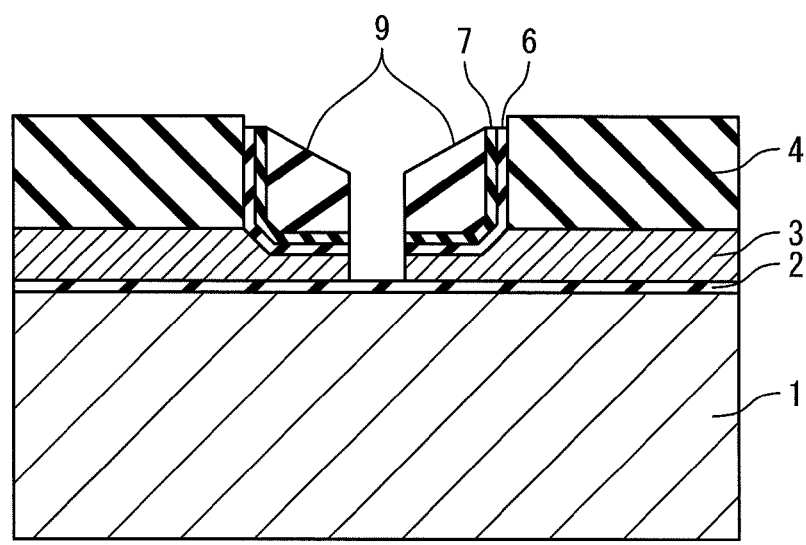
FIG. 4H is a sectional view illustrating a semiconductor structure in an eighth step of manufacturing the memory cell transistor MC.

FIG. 4H is a sectional view illustrating a semiconductor structure in an eighth step of manufacturing the memory cell transistor MC. In this eighth step, etching by use of the first spacers (silicon oxide films) 9 is performed. As a result, as shown in FIG. 4H, the first gate polysilicon film 3 exposed in the region Ra is removed.

Figure 4I:
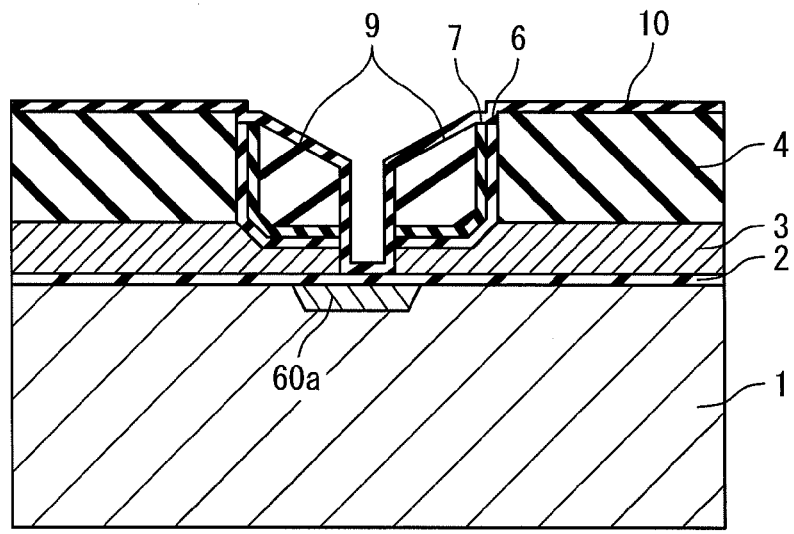
FIG. 4I is a sectional view illustrating a semiconductor structure in a ninth step of manufacturing the memory cell transistor MC.

FIG. 4I is a sectional view illustrating a semiconductor structure in a ninth step of manufacturing the memory cell transistor MC. In this ninth step, ions are implanted into part of the region Ra. As shown in FIG. 4I, the diffusion layer 60a serving as the source and the drain is formed at a p-well. In addition, a second oxide film 10 is deposited on an entire surface.

Figure 4J:
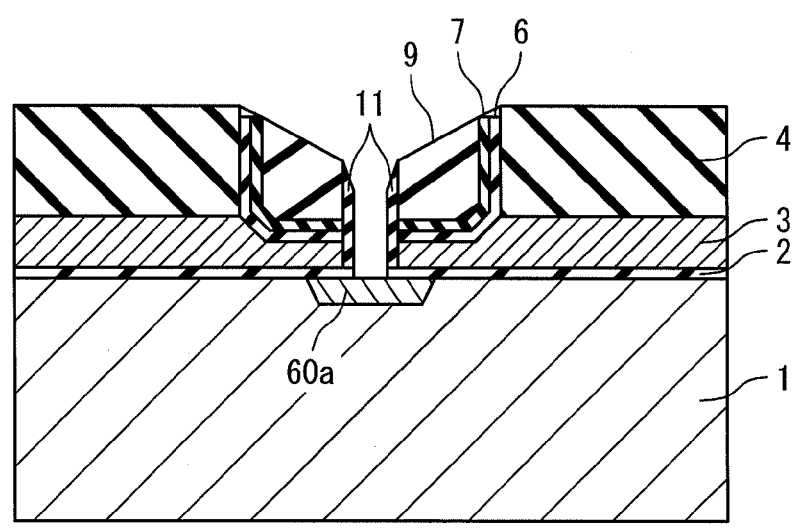
FIG. 4J is a sectional view illustrating a semiconductor structure in a tenth step of manufacturing the memory cell transistor MC.

FIG. 4J is a sectional view illustrating a semiconductor structure in a tenth step of manufacturing the memory cell transistor MC. In the tenth step, the second oxide film 10 is subjected to etch-back, whereby the plug-side spacers 11 are formed in a self-aligned manner, as shown in FIG. 4J. Specifically, a pair of plug-side spacers 11 is so formed as to face to each other in the region Ra. Each of the plug-side spacers 11 is in contact with a side surface of the first spacer (silicon oxide film) 9 and a side surface of the first gate polysilicon film 3.

Figure 4K:
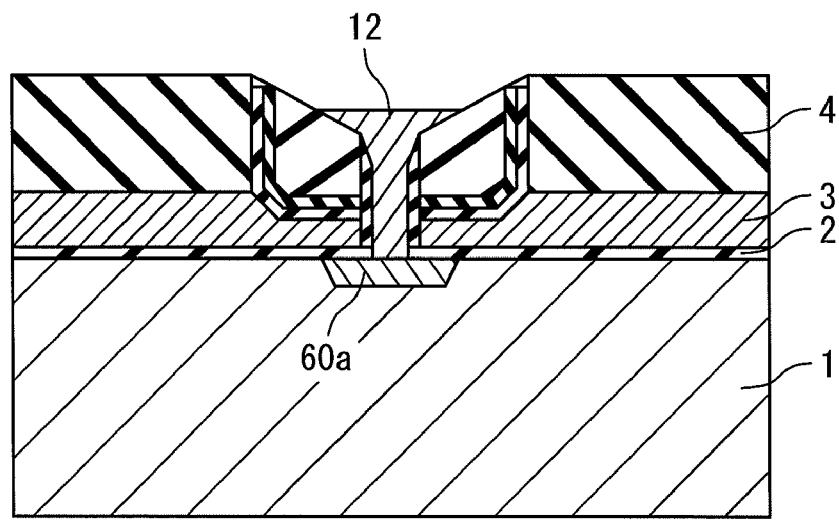
FIG. 4K is a sectional view illustrating a semiconductor structure in an eleventh step of manufacturing the memory cell transistor MC.

FIG. 4K is a sectional view illustrating a semiconductor structure in an eleventh step of manufacturing the memory cell transistor MC. In this eleventh step, a polysilicon film is deposited on an entire surface, and then CMP (Chemical Mechanical Polishing) is performed. As a result, as shown in FIG. 4K, the contact 12 is so formed as to be sandwiched between the plug-side spacers 11.

Figure 4L:
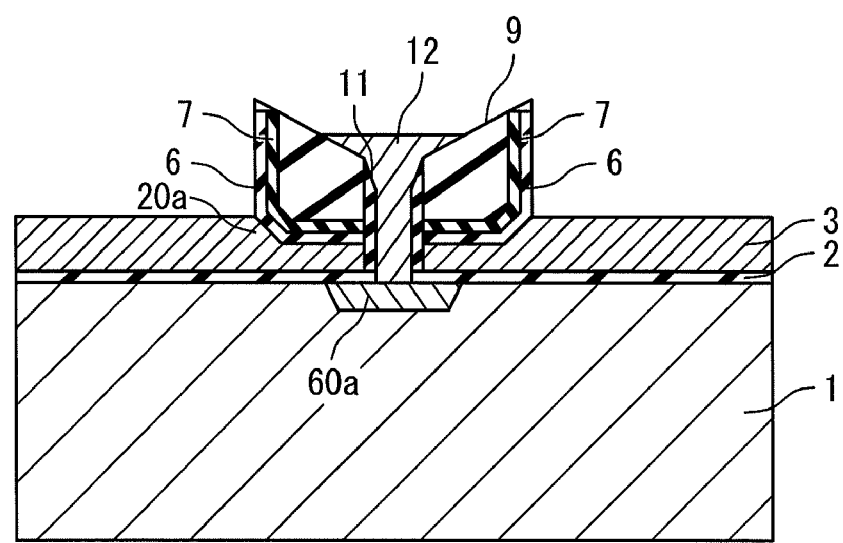
FIG. 4L is a sectional view illustrating a semiconductor structure in a twelfth step of manufacturing the memory cell transistor MC.

FIG. 4L is a sectional view illustrating a semiconductor structure in a twelfth step of manufacturing the memory cell transistor MC. In the twelfth step, as shown in FIG. 4L, the silicon nitride film 4 located outside the region Ra is removed by etching. Further, by dry etching with the first spacers (silicon oxide films) 9, the second spacers (silicon nitride films) 7, and the third spacers (silicon oxide films) 6 used as a mask, the first gate polysilicon film 3 located outside the region Ra is removed. As a result, below the first spacers (silicon oxide films) 9, the pair of floating gates 20 is formed in a self-aligned manner. This pair of floating gates 20 is formed on the both sides of the contact 12 with the plug-side spacers 11 therebetween. In addition, the tip part 20a is formed at the end part of the floating gate 20. The top surface of the floating gate 20 is concaved in such a manner as to face the contact 12.

Figure 4M:
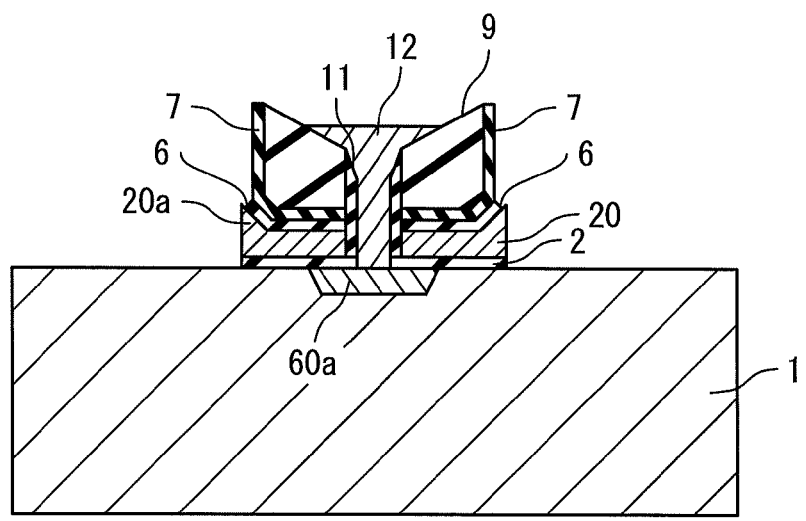
FIG. 4M is a sectional view illustrating a semiconductor structure in a thirteenth step of manufacturing the memory cell transistor MC.

FIG. 4M is a sectional view illustrating a semiconductor structure in a thirteenth step of manufacturing the memory cell transistor MC. In this thirteenth step, portions of the gate insulating film 2 and the third spacer (silicon oxide film) 6 in contact with the silicon nitride film 4 are removed by wet etching. When, for example, a BHF solution is used for this wet etching, the etching rate of the second spacers (silicon nitride films) 7 is approximately one hundredth of the etching rate of the portions of the third spacer (silicon oxide film) 6 in contact with the silicon nitride film 4. The second spacer (silicon nitride film) 7 with the etching rate smaller than that of the third spacer (silicon oxide film) 6 serves as an etching stopper when the wet etching is performed.

Figure 4N:
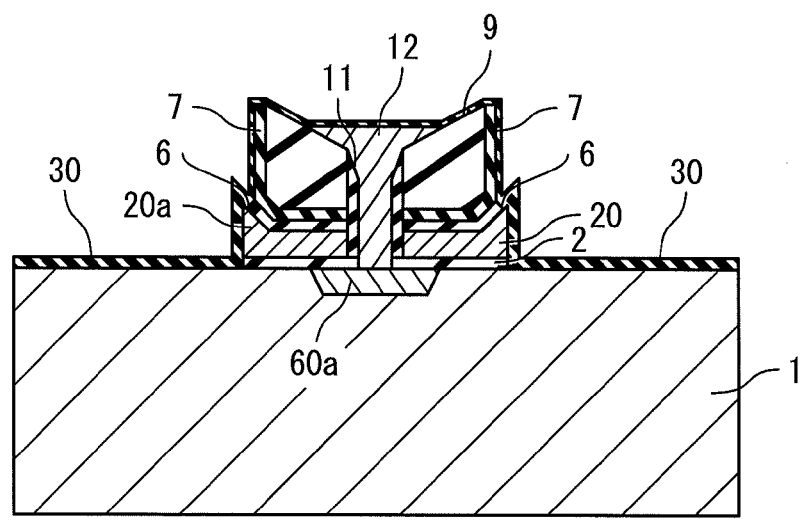
FIG. 4N is a sectional view illustrating a semiconductor structure in a fourteenth step of manufacturing the memory cell transistor MC.
Figure 4O:
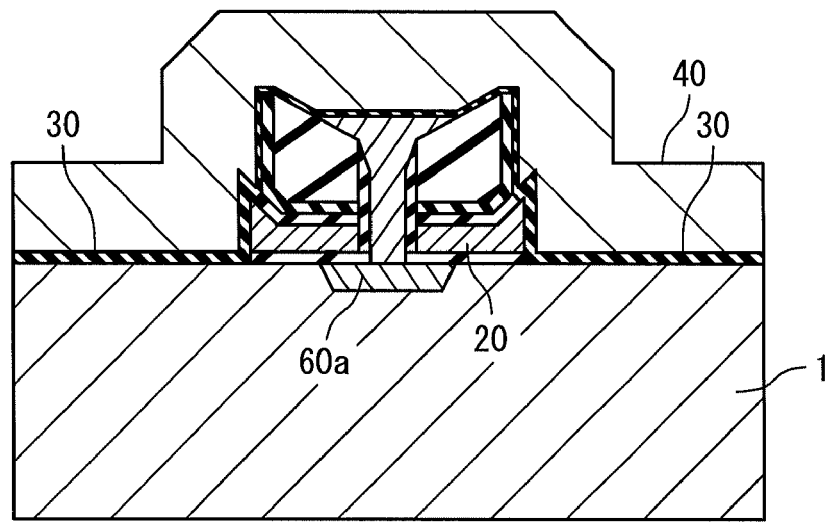
FIG. 4O is a sectional view illustrating a semiconductor structure in a fifteenth step of manufacturing the memory cell transistor MC.

FIG. 4N is a sectional view illustrating a semiconductor structure in a fourteenth step of manufacturing the memory cell transistor MC. In the fourteenth step, as shown in FIG. 4N, the tunnel oxide film 30 is made to be grown on an entire surface. FIG. 4O is a sectional view illustrating a semiconductor structure in a fifteenth step of manufacturing the memory cell transistor MC. In the fifteenth step, as shown in FIG. 4O, a second gate polysilicon film 40 is further formed on an entire surface. Subsequently, etching of this second gate polysilicon film 40 is performed.

Figure 4P:
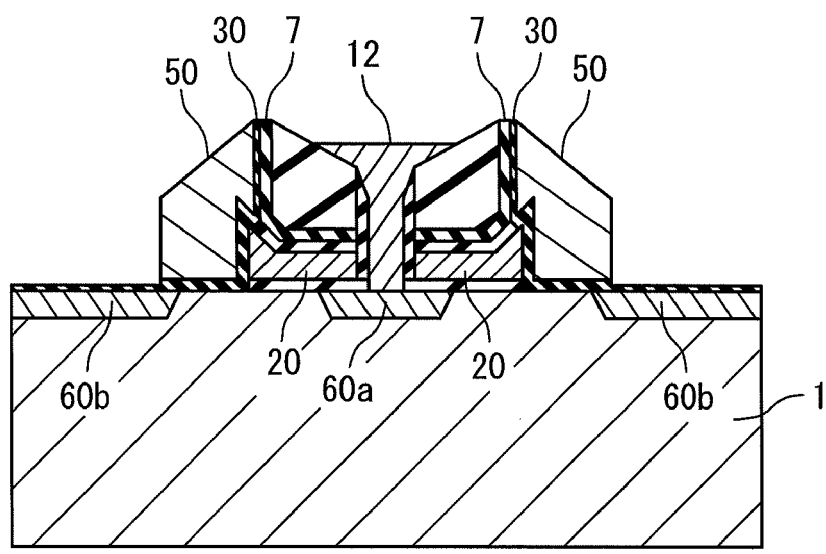
FIG. 4P is a sectional view illustrating a semiconductor structure in a sixteenth step of manufacturing the memory cell transistor MC.

FIG. 4P is a sectional view illustrating a semiconductor structure in a sixteenth step of manufacturing the memory cell transistor MC. In the sixteenth step, as shown in FIG. 4P, the control gates 50 are formed in a self-aligned manner. A pair of control gates 50 are each formed on an outer side of the floating gate 20 with the second spacer (silicon nitride film) 7 and the tunnel oxide film 30 therebetween. Etching is performed so that top surfaces of the control gates 50 become convexed. Next, ion implantation with the floating gates 20 and the control gates 50 used as a mask is performed. As a result, as shown in FIG. 4P, the diffusion layers 60b to serve as a source or a drain are formed in the p-well.

The portions of the gate insulating film 2 and the third spacer (silicon oxide film) 6 in contact with the silicon nitride film 4 are removed by the wet etching (FIG. 4M). For the solution for this wet etching, a solution diluted with hydrofluoric acid as a major component is used. The silicon nitride film has tolerance for this solution, and thus is not etched. Thus, the second spacer (silicon nitride film) 7 exposed after the third spacer (silicon oxide film) 6 is etched is not etched. In this manner, the memory cell transistor MC of the split-gate type shown in FIG. 3 is formed.

Embodiments of the present invention have been described in detail above. However, the present invention is not limited to the embodiments described above, and thus various modifications can be made thereto within a range not departing from spirits thereof.

What is claimed is:

1. A manufacturing method of a semiconductor memory device comprising:
   forming a first nitride film having a first opening portion on a polysilicon film after forming the polysilicon film on a gate insulating film formed on a substrate;
   forming a second nitride film on a surface of the first nitride film after forming a first oxide film covering a surface of the polysilicon film exposed in the first opening portion, a side surface of the first nitride film, and an upper surface of the first nitride film;
   forming a first spacer insulating film having a second opening portion and formed to be a sidewall shape after forming a second oxide film filling the first opening portion and performing an etch back to the second oxide film;
   removing the polysilicon film and the gate insulating film selectively in the second opening portion after removing the second nitride film and the first oxide film selectively by using the first spacer insulating film as a mask, and filling the second opening portion by polysilicon;
   performing a selective polysilicon film removal, wherein said performing the selective polysilicon film removal includes: removing the first nitride film to expose a surface of the polysilicon covered by the first oxide film and the first nitride film in a side region of the first spacer insulating film; and removing the polysilicon film selectively by using the first oxide film as a mask;
   removing the first oxide film on a side of the first spacer insulating film and the gate insulating film being exposed; and
   forming a control gate after forming a tunnel insulation film.

2. The manufacturing method of the semiconductor memory device according to claim 1, wherein in the forming the second nitride film comprises:
   forming the first oxide film to be thinner than the gate insulating film.

3. The manufacturing method of the semiconductor memory device according to claim 2, wherein the forming the second nitride film comprises:
   forming a slope portion on the polysilicon film exposed in the first opening portion; and
   forming a first oxide film to cover the slope portion.

4. The manufacturing method of the semiconductor memory device according to claim 3, wherein the performing the selective polysilicon film removal comprises:
   removing the gate insulating film selectively by using a sidewall insulating film as a mask after forming the sidewall insulating film in the second opening portion; and
   implanting impurity into the second opening portion.

* * * * *